(12) United States Patent
Sahu

(10) Patent No.: US 7,728,749 B2
(45) Date of Patent: Jun. 1, 2010

(54) MULTI-MODE DIGITAL-TO-ANALOG CONVERTER

(75) Inventor: Biranchinath Sahu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 12/196,292

(22) Filed: Aug. 22, 2008

(65) Prior Publication Data

US 2008/0309390 A1   Dec. 18, 2008

Related U.S. Application Data

(63) Continuation-in-part of application No. 12/137,385, filed on Jun. 11, 2008, now abandoned.

(60) Provisional application No. 60/943,330, filed on Jun. 12, 2007.

(51) Int. Cl.
*H03M 1/66* (2006.01)

(52) U.S. Cl. ................ 341/144; 341/120; 323/282; 323/283

(58) Field of Classification Search ................ 341/120, 341/144
See application file for complete search history.

(56) References Cited

U.S. PATENT DOCUMENTS

| 6,208,127 | B1* | 3/2001 | Doluca | 323/349 |
| 7,106,040 | B1* | 9/2006 | Maksimovic et al. | 323/314 |
| 7,501,801 | B2* | 3/2009 | Brown et al. | 323/224 |

* cited by examiner

*Primary Examiner*—Khai M Nguyen
(74) *Attorney, Agent, or Firm*—John J. Patti; Wade J. Brady, III; Frederick J. Telecky, Jr.

(57) ABSTRACT

Various apparatuses, methods and systems for a multi-mode DAC with selectable output range, granularity and offset and controlled slew rate are disclosed herein. For example, some embodiments of the present invention provide an apparatus for supplying a reference signal, including a digital-to-analog converter, a counter and a clock. The digital-to-analog converter has a digital input and an analog output that supplies a reference signal based on the digital input. The counter has a digital control word input, a clock input, a clock enable output and a count output connected to the digital input of the digital-to-analog converter. The counter is adapted to assert the clock enable output when the digital control word input requests an output count that is different from an actual count at the count output of the counter. The clock has an enable input connected to the clock enable output of the counter and a clock output connected to the clock input of the counter. The clock is adapted to produce clock pulses on the clock output while the enable input is asserted.

18 Claims, 3 Drawing Sheets

US 7,728,749 B2

MULTI-MODE DIGITAL-TO-ANALOG CONVERTER

CROSS REFERENCE TO RELATED APPLICATION

The present application claims priority to (i.e., is a continuation-in-part of) U.S. patent application Ser. No. 12/137,385 entitled "DUAL-MODE DIGITAL-TO-ANALOG CONVERTER (DAC) FOR IMVP CPU AND CRESTLINE GRAPHICS POWER SUPPLY CONTROLLERS", and filed Jun. 11, 2008 by Biranchinath Sahu, which claims priority to (i.e., is a non-provisional of) U.S. Provisional Patent Application No. 60/943,330 entitled "DUAL-MODE DIGITAL-TO-ANALOG CONVERTER (DAC) FOR IMVP CPU AND CRESTLINE GRAPHICS POWER SUPPLY CONTROLLERS", and filed Jun. 12, 2007. The aforementioned application is assigned to an entity common hereto, and the entirety of the aforementioned application is incorporated herein by reference for all purposes.

BACKGROUND OF THE INVENTION

The present invention is related to a multi-mode digital-to-analog converter (DAC) and more particularly to a multi-mode DAC with selectable output range, granularity (or resolution) and offset and controlled slew rate.

Digital-to-analog converters are used in many electronic circuits to provide adjustable analog reference signals (voltage and current). The analog output signal may be set to different levels by changing the value of a digital control word at the control input to the DAC. For example, many power supply circuits rely on an analog reference signal to set the output voltage or current from the power supply. Adjustable power supplies may therefore need a DAC to generate an adjustable reference signal. As the digital control word at the input of the DAC is changed, the analog reference signal to the power supply is changed and the output voltage or current from the power supply follows the changes in the analog reference signal from the DAC.

Digital-to-analog converters are typically designed with a fixed granularity (resolution or step-size), output range and bias value or offset. Each sequential step in the digital control word increases or decreases the analog output by a fixed amount, which is also known as step-size of least-significant bit (LSB). For example, given a DAC with a fixed output range of 5 volts and a 3-bit digital control word with a range of 0-7 where an input of 0 selects an output of 0V and an input of 5 selects an output of 5V, the analog output may be changed in increments of 1/7 of the 5 volt maximum, or about 0.7 volts. Based on the requirements of the power supply, the granularity and output range may fixed at different values, and is not necessarily limited to an even division of the fixed output range by the number of possible input values according to the width or number of bits in the digital control word. For example, an application may specify that the output granularity is to be in steps of 0.1V with a range of 5V, which would leave a number of unused values in a 6-bit digital control word. The DAC may also be designed to provide a fixed offset or bias in the analog output. For example, given a digital input of 0, the DAC may be configured to generate a non-zero analog output such as 2.5 volts as the fixed lower limit.

For complex electronic systems requiring multiple different reference signals, such as a notebook computer requiring power supplies with several different individually adjustable voltage levels to power various subsystems, multiple conventional DACs are needed to provide the different reference signals. This is particularly true when the various subsystems or operational modes have different requirements for the granularity, output range and offset of the DAC.

The use of a conventional DAC to provide an analog reference signal can also cause noise or other problems due to the rapid slew rate, particularly if large changes are made to the digital control word causing the analog output to respond to the rapid and drastic changes its reference signal goes through. This problem is typically addressed using a buffer amplifier at the output of the DAC to drive a capacitor. This slows changes in the analog reference signal due to the time constant of the system, including the capacitor value. If the DAC and buffer amplifier are embodied in an integrated circuit, the capacitor is typically an external capacitor, requiring a dedicated pin on the integrated circuit to connect the capacitor. The capacitor must be changed from application to application based on the desired slew rate. Furthermore, even with an external capacitor, the slew rate cannot be precisely controlled because the current of the buffer amplifier that charges and discharges the capacitor is process, supply voltage and temperature dependent. Furthermore, if multiple DACs of such type are embodied in one integrated circuit, multiple external pins are needed to connect external capacitances resulting in a higher pin-count and thereby higher cost, not to mention the additional capacitances themselves increasing the overall component count of the electronic system.

Thus, for at least the aforementioned reason, there exists a need in the art for a DAC with selectable output range, granularity and offset and controlled slew rate of its output voltage during transition. Additionally, slew-rate for multiple DACs in one IC should be controlled by the user with one external pin.

BRIEF SUMMARY OF THE INVENTION

The present invention is related to a multi-mode digital-to-analog converter (DAC) and more particularly to a multi-mode DAC with selectable output range, granularity and offset and controlled slew rate.

Various apparatuses, methods and systems for a multi-mode DAC with selectable output range, granularity and offset and controlled slew rate are disclosed herein. For example, some embodiments of the present invention provide an apparatus for supplying a reference signal, including a digital-to-analog converter, a counter and a clock. The digital-to-analog converter has a digital input and an analog output that supplies a reference signal based on the digital input. The counter has a digital control word input, a clock input, a clock enable output and a count output connected to the digital input of the digital-to-analog converter. The counter is adapted to assert the clock enable output when the digital control word input is different from an actual output state of the counter. The clock has an enable input connected to the clock enable output of the counter and a clock output connected to the clock input of the counter. The clock is adapted to produce clock pulses on the clock output while the enable input is asserted. The counter has a comparator, which compares the target state of the counter to its present state and decides if the counter should move up or down. In some embodiments, the counter changes state based on an internal clock that is based on an XOR combination of the clock enable output of the counter and the clock input to the counter. Thus, the response time of the counter and therefore the DAC to changes on the digital control word input are minimized.

In other instances of the aforementioned apparatus a control word processor is included having a digital control word input, a mode indicator input and a digital control word output. The digital control word output of the control word processor is connected to the digital control word input of the counter. The control word processor is adapted to produce a translated digital control word at the digital control word output based on the digital control word at the digital control word input depending on which mode it is programmed or configured to operate in. One of a plurality of translation configurations is selected based on the state of the mode indicator input.

In various cases, the apparatus further includes a mode detector having an input and a mode indicator output. The mode indicator output is connected to the mode indicator input of the control word processor. The mode detector is adapted to assert the mode indicator output when a voltage level at the input is greater than a predetermined reference voltage level that is greater than a normal operating voltage of the most significant bit of the digital control word input when asserted. The mode detector may have multiple comparators with multiple thresholds which can be used separately or with a combination of thereof to select various modes of operation for the DAC. The input to the mode detector can be supplied by user via a separate pin if all the bits from input control word are needed for the DAC.

Other embodiments of the present invention provide methods for supplying a reference signal, including reading a digital control word specifying a desired level for a reference signal, comparing the digital control word with a digital value representing the reference signal, enabling a clock while the digital value is not in accordance with the digital control word, counting at least one pulse of the clock to change the digital value, and converting the digital value into an analog value for the reference signal. The number of times the counter counts up or down depends on the difference of input digital control world and current digital value of the reference.

Yet other embodiments of the present invention provide electronic systems, including a digital-to-analog converter, counter, clock, control word processor, mode detector, digital-to-analog reference generator, and a slew rate bias generator. The digital-to-analog converter has a digital input and an analog output that supplies a reference signal based on the digital input. The counter has a digital control word input, a clock input, a clock enable output and a count output connected to the digital input of the digital-to-analog converter. The counter is adapted to assert the clock enable output when the digital control word input requests an output count that is different from an actual count at the count output of the counter. The clock has an enable input connected to the clock enable output of the counter and a clock output connected to the clock input of the counter. The clock is adapted to produce clock pulses on the clock output while the enable input is asserted. The control word processor has a digital control word input, a mode indicator input and a digital control word output that is connected to the digital control word input of the counter. The control word processor is adapted to produce a translated digital control word at the digital control word output based on the digital control word at the digital control word input. One of a plurality of translation configurations is selected based on a state of the mode indicator input. The mode detector has an input and a mode indicator output that is connected to the mode indicator input of the control word processor. The mode detector is adapted to assert the mode indicator output when a voltage level at the input is greater than a predetermined reference voltage level. The input of the mode detector is connected to a most significant bit of the digital control word input of the control word processor. The predetermined reference voltage level is greater than a normal operating voltage of the most significant bit of the digital control word input when asserted. The digital-to-analog reference generator has a mode indicator input and a digital-to-analog reference output. The mode indicator input is connected to the mode indicator output of the mode detector. The digital-to-analog reference output is connected to a reference input on the digital-to-analog converter. The digital-to-analog reference generator is adapted to generate one of a plurality of levels at the digital-to-analog reference output based on a state of the mode indicator input to set a maximum value of the reference signal from the analog output of the digital-to-analog converter. The slew rate bias generator has an output connected to a bias input on the clock. The slew rate bias generator sets a speed of the clock by a current level on the bias input of the clock. The slew rate of the digital-to-analog converter is adjusted by the current level on the bias input of the clock.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Figure 1:
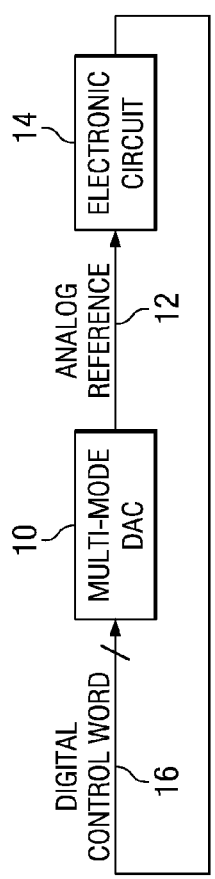
FIG. 1 depicts a block diagram of a multi-mode DAC providing a reference signal to an electronic circuit in accordance with some embodiments of the present invention.

The drawings and description, in general, disclose various embodiments of a multi-mode digital-to-analog converter (DAC) 10 (FIG. 1) which may be used to provide a configurable analog reference voltage 12 or current for an electronic circuit 14, based on a digital control word 16. The multi-mode DAC 10 may be configured in one of multiple modes, for example with configurable digital control word formats, output ranges, granularity and offsets. The multi-mode DAC 10 also provides a controlled slew rate to avoid sudden large changes on the analog output, while remaining rapidly responsive to changes to the digital control word at the input. The multi-mode DAC 10 may be used wherever an analog reference signal is needed by an electronic circuit. In some particular embodiments of the present invention, the multi-mode DAC 10 is used in a power supply controller integrated circuit to supply the analog reference voltage for a power supply. In particular, in some embodiments the multi-mode DAC 10 may be used in the power supply controller for a notebook computer. For example, Intel's mobile voltage positioning (IMVP) standard for notebook power supply controllers defines separate input voltage identification (VID) tables for its central processing unit (CPU) and graphics processing unit (GPU). This invention describes a programmable digital-to-analog converter (DAC) architecture that supports both VID codes, which can be configured by the user without any additional pins, thereby enabling the flexibility of using the same controller for both applications.

In a VID controlled power supply upward and downward transition timing of the DAC output is needed to support various modes (sleep-mode, C4 entry/exit, 1-ph/2-ph) and engage different ways of output voltage monitoring (blanking for OVP/UVP, etc.) to ensure reliable and efficient operation of power supply. Slew rate control of conventional DAC systems to achieve the desired transition timing is accomplished using a buffer amplifier driving an external capacitor to add a longer time constant to the DAC output. The slew rate can be manually adjusted in conventional DAC systems by changing the value of the external capacitor. Conventional power supplies using a current source/sink and a capacitor also require analog monitoring circuitry to determine DAC output transitions. In the multi-mode DAC 10 according to various embodiments of the present invention, the output is changed using an up-down logic counter with the slew rate being set by a clock, whose frequency may be controlled by current source/sink via an external resistor for user programmability. Transitions on the output of the multi-mode DAC 10 in the up or down direction are easily monitored through digital control signals using combinational logic circuit, which is not only accurate but also less power hungry.

Figure 2:
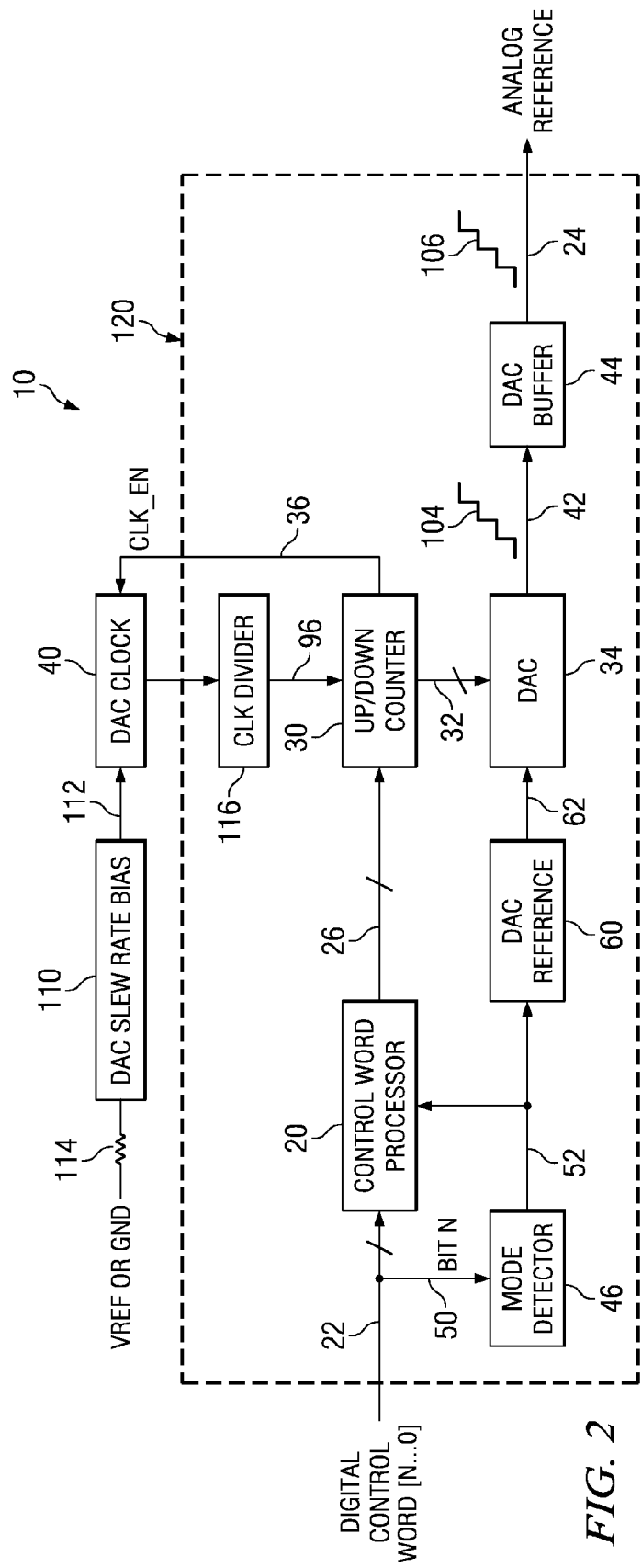
FIG. 2 depicts a block diagram of a multi-mode DAC in accordance with some embodiments of the present invention.

Turning now to FIG. 2, a multi-mode DAC includes a control word processor 20 that processes the digital control word 22 to determine the level of the analog reference signal 24 on the output of the multi-mode DAC 10 and to determine the mode in which the multi-mode DAC 10 is to operate. For example, in one particular embodiment of the invention, the digital control word 22 carries the VID codes specifying the desired output level, and one or more of the bits in the digital control word 22 can serve a dual purpose to specify the desired mode as will be described in more detail below. The control word processor 20 processes the digital control word 22 and depending on the selected mode generates actual target codes (also referred to herein as a translated digital control word 26) that feed an up/down counter 30. The up/down counter 30 incorporates additional combinational logic circuitry that compares the translated digital control word 26 with the DAC code 32 at the output of the up/down counter 30. The up/down counter 30 determines if the present DAC code 32 is different from the translated digital control word 26 and changes the DAC code 32 provided as the input to a DAC 34. The combinational logic in the up/down counter 30 also generates a clock enable signal 36 that enables a DAC clock 40 for the up/down counter 30 when the digital control word 22 changes to a new target value. The up/down counter 30, depending on the DAC clock 40, transitions from its present state to the target value through intermediate DAC codes 32. As the up/down counter 30 traverses from its initial state to the target state, the output 42 of the DAC 34 changes, as well as the analog reference signal 24 at the output of a DAC buffer 44 connected to the DAC 34.

The control word processor 20 is a combinational logic circuit that maps input digital control word 22 bits to actual input codes for the DAC 34 to generate analog voltage levels that represent the specific input code in a given operational mode. Consequently, the actual DAC 34 or DAC buffer 44 need not be redesigned for supporting multi-mode operation. As a result, not only can one controller can support dual-mode operation, but also circuit blocks can be reused in different controllers without changing the analog blocks. Note that the multi-mode DAC 10 may be adapted to produce either an analog reference voltage signal or current signal, as desired.

Figure 3:
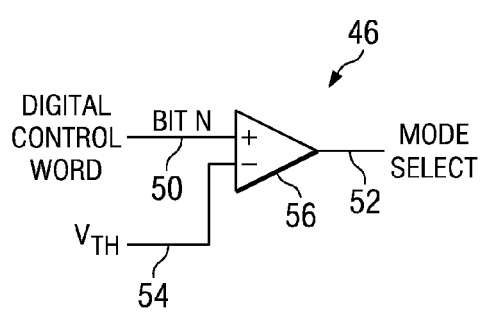
FIG. 3 depicts a schematic of a mode detector for a multi-mode DAC in accordance with some embodiments of the present invention.

The mode is detected by a mode detector 46 which examines a mode input 50 and produces a mode indicator output 52. In one particular embodiment, the mode input 50 is the most significant bit (MSB) of the digital control word 22. In other embodiments, a dedicated mode signal may be included rather than using a bit of the digital control word 22. In the particular embodiments using the MSB of the digital control word 22, the voltage level of the mode input 50 is examined to determine the mode for the multi-mode DAC 10 as illustrated in FIG. 3. The mode input 50 is compared with a threshold voltage 54 by a comparator 56. The threshold voltage 54 is set at a higher voltage than the normal operating voltage of the mode input 50 when asserted. Thus, the mode input 50 can serve a dual purpose. In one mode, it carries the MSB of the digital control word 22. In another mode, it is tied to a fixed voltage that is higher than the normal operating voltage when used to carry the MSB of the digital control word 22. For example, in a 5V system, if the digital control word 22 normally varies between about 0.7 volts when off and 4.3 volts when asserted, the mode input 50 may be tied to a 5V source to place that the multi-mode DAC 10 in the second mode. In this case, the threshold voltage 54 in the mode detector 46 could be set at about 4.6 volts, so the comparator 56 will place the multi-mode DAC 10 in the first mode when the mode input 50 carries the MSB of the digital control word 22, between about 0.7V and 4.3V, and in the second mode when the mode input 50 is tied to 5V. Again, note that these voltage levels are purely exemplary. In one particular embodiment, the first mode uses a 7-bit digital control word 22 or VID code and the second mode uses a 5-bit digital control word 22. If the MSB of the digital control word 22 (bit 6, the mode input 50) is tied to a relatively high fixed voltage source such as the analog power supply, the multi-mode DAC 10 is placed in the second mode. The second most significant bit of the digital control word 22, bit 5, is ignored and unused, and bits 4-0 of the digital control word 22 are used to specify the target output of the analog reference 24. Note that in some particular embodiments the mode detector 46 may include multiple comparators (e.g., 56) with different threshold voltages (e.g., 54), enabling the multi-mode DAC 10 to function in more than two modes.

Figure 4:
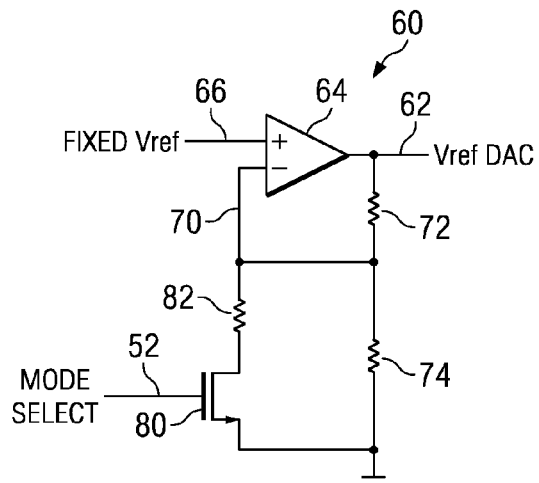
FIG. 4. depicts a schematic of a bias generator for a multi-mode DAC in accordance with some embodiments of the present invention.

The multi-mode DAC 10 also includes a DAC reference 60 that generates a reference voltage 62 for the DAC 34, setting the maximum level of the output 42. For example, if the DAC 34 is an R-ladder or R-2R ladder DAC, the reference voltage 62 is used as a voltage supply that is divided by a resistive ladder to form the possible output voltage levels. The DAC reference 60 provides an adjustable reference voltage 62 for the DAC 34 so that the maximum output voltage of the output 42 of the DAC 34 is also adjustable. The DAC reference 60 selects one of several possible voltage levels for the reference voltage 62 based on the state of the mode indicator output 52 from the mode detector 46. Turning now to FIG. 4, the DAC reference 60 comprises a differential amplifier 64 that compares a fixed reference voltage 66 with a feedback voltage 70 based on the reference voltage 62. For example, a voltage divider made up of two resistors 72 and 74 between reference voltage 62 and ground 76 can be used to divide the reference voltage 62 to generate the feedback voltage 70. A switch 80 may be used to switch in another resistor 82 in parallel with the lower resistor 74 in the voltage divider under the control of the mode indicator output 52 from the mode detector 46, thereby changing the voltage of the feedback voltage 70 and thus the reference voltage 62 from the differential amplifier 64. Note that the DAC reference 60 may be adapted to generate two reference levels for the DAC 34 as shown in FIG. 4, or may be adapted to generate more than two reference levels for multi-mode DACs 10 with more than two modes of operation. In one particular embodiment, the first mode requires a granularity of 12.5 mV, that is, a 12.5 mV LSB on the digital control word 22, while the second mode requires a granularity of 25.75 mV with an offset. Thus, in the first mode, if the digital control word 22 is set to zero, the analog reference 24 will be at zero volts, whereas in the second mode, if the digital control word 22 is set to zero, the analog reference 24 will be at a non-zero offset voltage. This offset can be provided by the control word processor 20 by mapping a zero value in the digital control word 22 to a non-zero value in the DAC code 32 provided to the DAC 34. The desired granularity from the DAC 34 can be provided by the mapping of the digital control word 22 in the control word processor 20 or by varying the reference voltage 62 in the DAC reference 60, or by a combination of the two. For example, given a DAC 34 with a fixed design and a fixed number of output levels, the output granularity is increased by providing a lower reference voltage 62 so that when divided in the DAC 34, the output steps are smaller. Conversely, output granularity is decreased by providing a higher reference voltage 62 so that when divided in the DAC 34, the output steps are larger. The output granularity can also be affected by the mapping of the digital control word 22 in the control word processor 20 even for a fixed R-ladder or R-2R ladder DAC by mapping consecutive input values to non-consecutive output values, for example, skipping every other possible output value to halve the granularity. (Note that because the DAC 34 is driven by the up/down counter 30, each possible output value will still be used, so this type of mapping to decrease the granularity will increase the time needed to move between selected output levels.)

Figure 5:
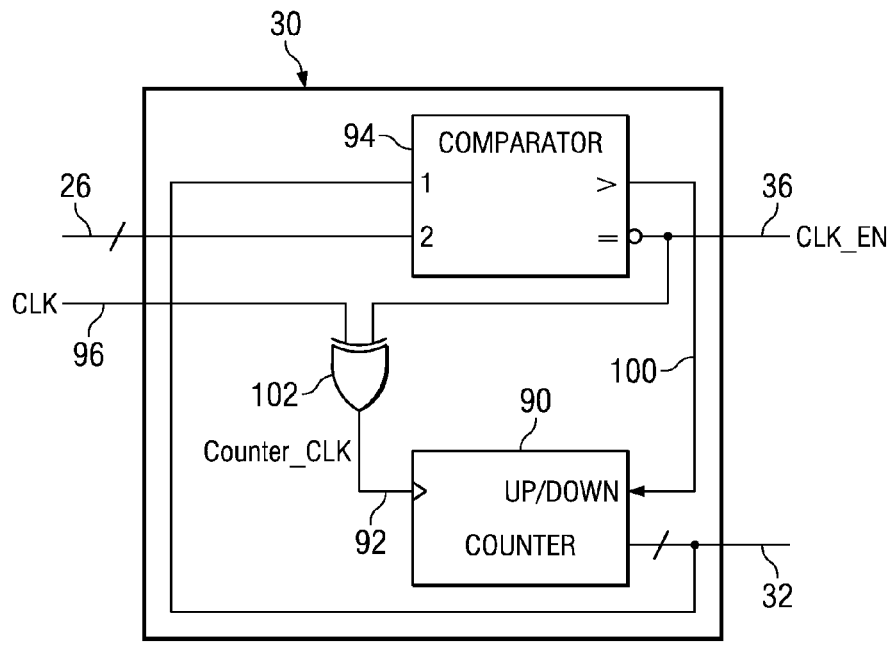
FIG. 5 depicts a schematic of an up/down counter with a clock enable generator for a multi-mode DAC in accordance with some embodiments of the present invention.
Figure 6:
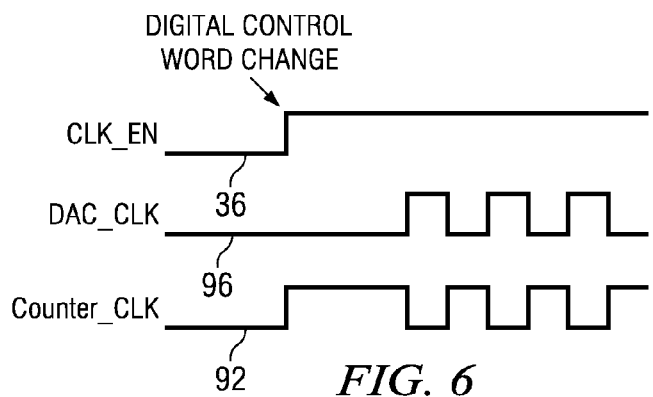
FIG. 6 depicts a timing diagram of clocks used to drive an up/down counter for a multi-mode DAC in accordance with some embodiments of the present invention.

Turning now to FIG. 5, the up/down counter 30 includes a counter circuit 90 that counts either up or down whenever a counter clock signal 92 cycles. The clock enable signal 36 is generated in the up/down counter 30 by a comparator 94 that compares the DAC code 32 output from the counter circuit 90 with the translated digital control word 26 provided to the up/down counter 30 by the control word processor 20. If the DAC code 32 and the translated digital control word 26 are different, the digital control word 22 has requested a different analog reference 24 and the comparator 94 asserts the clock enable signal 36. This enables the DAC clock 40 to being transitioning so that the clock signal 96 from the DAC clock 40 cycles, causing the counter circuit 90 to change values. The direction of the counter circuit 90 may also be controlled by a signal 100 from the comparator 94, with the counter circuit 90 set to count up if the output DAC code 32 is less than the translated digital control word 26 and to count down if the DAC code 32 is greater than the translated digital control word 26. In one particular embodiment, the analog reference 24 must respond rapidly to changes in the digital control word 22. Whenever there is a change in input control word, the clock takes some time to start. To minimize the response time of the DAC, the counter clock 92 is generated by combining the clock enable signal 36 with the clock signal 96 from the DAC clock 40 in an XOR gate 102. As illustrated in the timing diagram of FIG. 6, the counter clock signal 92 thus begins to cycle as soon as the clock enable signal 36 is asserted and continues to cycle when the clock signal 96 is enabled and running. Thus, the clock enable signal 36 from the logic is used as the first edge of the counter clock signal 92.

Turning back to FIG. 2, the slew rate of the analog reference 24 from the multi-mode DAC 10 can be precisely controlled by changing the speed of the DAC clock 40. When the digital control word 22 changes, the output 42 of the DAC 34 and the analog reference 24 each transition through a series of voltage or current level steps 104 and 106 to get from an initial value to a target value. In contrast, a conventional DAC would simply jump from the initial value to the target value, potentially causing a sudden large change in the analog reference 24 that might require an RC filter to control. The speed at which the multi-mode DAC 10 transitions through the steps 104 and 106 is controlled by the speed of the DAC clock 40, which is controlled by a DAC slew rate bias circuit 110. The DAC slew rate bias circuit 110 provides a reference current or voltage 112 to the DAC clock 40 to control the speed of the DAC clock 40. For example, the DAC clock 40 may comprise a voltage controlled oscillator which is charged by the current 112 from the DAC slew rate bias circuit 110. The level of the current 112 from the DAC slew rate bias circuit 110 may be controlled by a resistor 114, external to an IC in which the multi-mode DAC 10 may be contained. Note that the clock signal 96 from the DAC clock 40 may also be divided in a fixed or configurable fashion in a clock divider 116.

Figure 7:
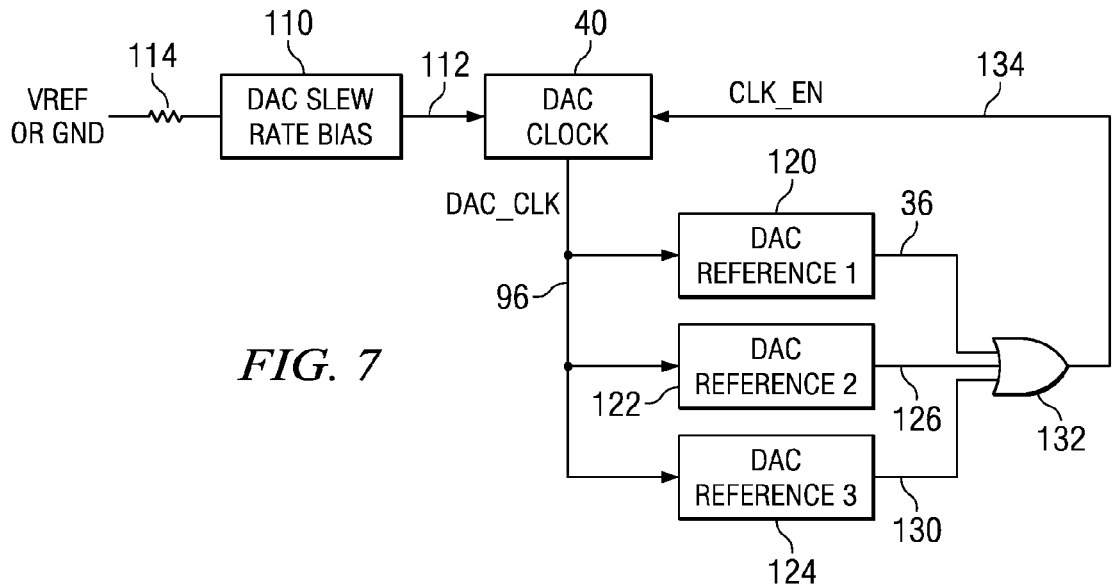
FIG. 7 depicts a block diagram of a shared DAC clock system for multiple DACs in accordance with some embodiments of the present invention.

Turning now to FIG. 7, multiple DAC reference circuits (e.g., 120, FIG. 2) may share a common clock source, providing a common slew rate control system for multiple multi-mode DACs. Each DAC reference circuit 120, 122, 124 may contain a programmable clock divider (e.g., 116) to allow the clock frequency and hence the slew rate of each DAC reference circuit 120, 122 and 124 to be controlled independent of each other. The clock dividers (e.g., 116) may be individually programmable, for example using an EEPROM or one-time programmable (OTP) circuit, either during manufacture and test or by the user. Each DAC reference circuit 120, 122, 124 generates its own clock enable signal 36, 126 and 130, which are combined in an OR gate 132 to produce a common clock enable signal 134 used to enable the shared DAC clock 40. Thus, if any DAC reference circuit 120, 122, 124 receives a change in digital control word 22, the DAC clock 40 is enabled. The up/down counter 30 in each DAC reference circuit 120, 122, 124 may have an internal counter enable signal in this embodiment, based on its own clock enable signal 36, 126 or 130, so that it only counts when it receives a change in its digital control word 22. Because the up/down signal for each counter and its clock are not synchronized, which means if there is an external digital control word transition right at the same time that the counter is transitioning its state, there might be set-up or hold time violation resulting in improper transition. To overcome this problem, the up/down signal for the counter may be blanked appropriately before and after the positive clock edge, which is when transition occurs.

Figure 8:
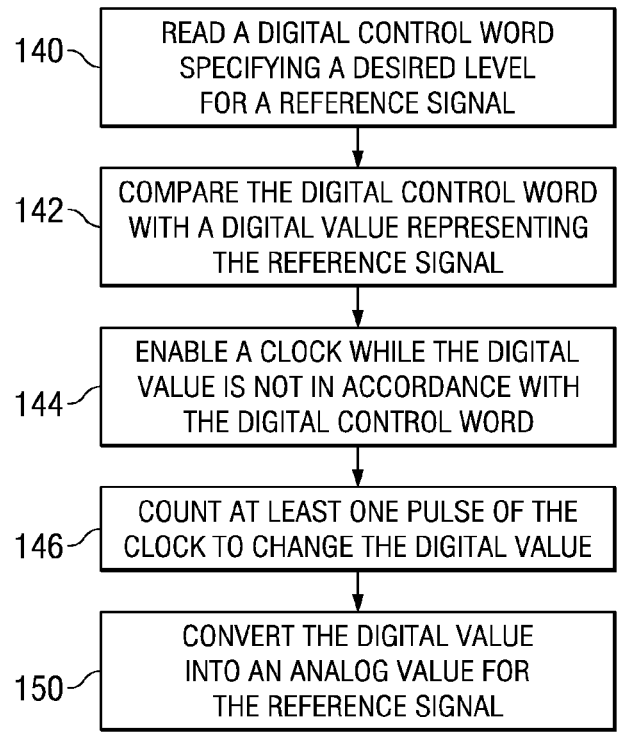
FIG. 8 is a flow chart of a method for providing a reference signal in accordance with some embodiments of the present invention.

Turning now to FIG. 8, a method of providing a reference signal will be summarized. In one particular embodiment, the method includes reading a digital control word specifying a desired level for a reference signal. (Block 140) The digital control word may be provided in any suitable fashion and format, such as in a multi-bit parallel or serial data word from an electronic system using the reference signal. The method also includes comparing the digital control word with a digital value representing the reference signal. (Block 142) For example, the input digital control word may be compared with an internal digital word provided to a DAC (e.g., 34) by an up/down counter (e.g., 30) to determine whether the output (e.g., 24) needs to be changed to provide the level requested by the input digital control word. The method also includes enabling a clock while the digital value is not in accordance with the digital control word, (Block 144) and counting at least one pulse of the clock to change the digital value. (Block 146) The method also includes converting the digital value into an analog value for the reference signal. (Block 150)

In conclusion, the present invention provides novel systems, devices, methods and arrangements for a multi-mode DAC with selectable output range, granularity and offset and controlled slew rate, and rapid response to an input control word change. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
    a digital-to-analog converter having a digital input and an analog output, wherein the analog output supplies a reference signal based on the digital input;
    a counter having a digital control word input, a clock input, a clock enable output and a count output connected to the digital input of the digital-to-analog converter, the counter being adapted to assert the clock enable output when the digital control word input requests an output state that is different from an actual state at the count output of the counter, wherein the counter including an XOR gate having a first input connected to the counter clock input, a second input connected to the counter clock enable output, and an output connected to an internal clock input in the counter so that the counter changes state when the clock produces clock pulses or when the counter clock enable output is asserted; and
    a clock having an enable input connected to the clock enable output of the counter and a clock output connected to the clock input of the counter, the clock being adapted to produce clock pulses on the clock output while the enable input is asserted.

2. The apparatus of claim 1, further comprising a clock divider connected between the clock and the counter.

3. The apparatus of claim 1, further comprising at least a second digital-to-analog converter and a second counter connected to the clock, wherein each counter in the apparatus comprises a clock enable output, wherein each of the clock enable outputs from the counters is combined in an OR gate to form a combined clock enable output connected to the enable input of the clock.

4. An apparatus comprising:
    a digital-to-analog converter having a digital input and an analog output, wherein the analog output supplies a reference signal based on the digital input;
    a counter having a digital control word input, a clock input, a clock enable output and a count output connected to the digital input of the digital-to-analog converter, the counter being adapted to assert the clock enable output when the digital control word input requests an output state that is different from an actual state at the count output of the counter;
    a clock having an enable input connected to the clock enable output of the counter and a clock output connected to the clock input of the counter, the clock being adapted to produce clock pulses on the clock output while the enable input is asserted; and
    a control word processor having a digital control word input, a mode indicator input and a digital control word output, the digital control word output of the control word processor connected to the digital control word input of the counter, the control word processor being adapted to produce a translated digital control word at the digital control word output based on the digital control word at the digital control word input, wherein one of a plurality of translation configurations is selected based on a state of the mode indicator input.

5. The apparatus of claim 4, further comprising a mode detector having an input and a mode indicator output, the mode indicator output being connected to the mode indicator input of the control word processor, the mode detector being adapted to assert the mode indicator output when a voltage level at the input is greater than a predetermined reference voltage level.

6. The apparatus of claim 5, wherein the input of the mode detector is connected to a most significant bit of the digital control word input of the control word processor, and wherein the predetermined reference voltage level is greater than a normal operating voltage of the most significant bit of the digital control word input when asserted.

7. The apparatus of claim 5, further comprising a digital-to-analog reference generator having a mode indicator input and a digital-to-analog reference output, the mode indicator input being connected to the mode indicator output of the mode detector, and the digital-to-analog reference output being connected to a reference input on the digital-to-analog converter, wherein the digital-to-analog reference generator is adapted to generate one of a plurality of levels at the digital-to-analog reference output based on a state of the mode indicator input to set a maximum value of the reference signal from the analog output of the digital-to-analog converter.

8. An apparatus comprising:
    a digital-to-analog converter having a digital input and an analog output, wherein the analog output supplies a reference signal based on the digital input;
    a counter having a digital control word input, a clock input, a clock enable output and a count output connected to the digital input of the digital-to-analog converter, the counter being adapted to assert the clock enable output when the digital control word input requests an output state that is different from an actual state at the count output of the counter;
    a clock having an enable input connected to the clock enable output of the counter and a clock output connected to the clock input of the counter, the clock being adapted to produce clock pulses on the clock output while the enable input is asserted; and
    a slew rate bias generator having an output connected to a bias input on the clock, wherein the slew rate bias generator sets a speed of the clock by a current level on the bias input of the clock, wherein a slew rate of the digital-to-analog converter is adjusted by the current level on the bias input of the clock.

9. The apparatus of claim 8, further comprising a resistor connected to a control input on the slew rate bias generator, wherein the slew rate bias generator is adapted to set the current level on the bias input of the clock based on a value of the resistor.

10. A method for supplying a reference signal, the method comprising:
- reading a digital control word specifying a desired level for a reference signal;
- comparing the digital control word with a digital value representing the reference signal;
- enabling a clock while the digital value is not in accordance with the digital control word;
- counting at least one pulse of the clock to change the digital value;
- converting the digital value into an analog value for the reference signal; and
- converting the digital control word from a first format to a second format.

11. The method of claim 10, wherein said counting comprises changing a state of a counter when either a clock enable signal or the clock is exclusively asserted.

12. The method of claim 10, further comprising:
- comparing a voltage level of a most significant bit of the digital control word with a reference voltage that is higher than a normal operating voltage of the most significant bit of the digital control word when asserted; and
- selecting the second format based on a result of the comparison of the voltage level of the most significant bit of the digital control word.

13. The method of claim 12, further comprising setting a maximum level of the reference signal based on the result of the comparison of the voltage level of the most significant bit of the digital control word.

14. The method of claim 10, further comprising supplying at least one second reference signal and comparing the digital control word with a second digital value representing the second reference signal, wherein the clock is enabled when any of the digital value or the second digital value is not in accordance with the digital control word.

15. The method of claim 10, further comprising setting a slew rate for a change in the analog value for the reference signal by changing a speed of the clock.

16. The method of claim 15, further comprising dividing the clock.

17. An electronic system comprising:
- a digital-to-analog converter having a digital input and an analog output, wherein the analog output supplies a reference signal based on the digital input;
- a counter having a digital control word input, a clock input, a clock enable output and a count output connected to the digital input of the digital-to-analog converter, the counter being adapted to assert the clock enable output when the digital control word input requests an output count that is different from an actual count at the count output of the counter;
- a clock having an enable input connected to the clock enable output of the counter and a clock output connected to the clock input of the counter, the clock being adapted to produce clock pulses on the clock output while the enable input is asserted;
- a control word processor having a digital control word input, a mode indicator input and a digital control word output, the digital control word output of the control word processor connected to the digital control word input of the counter, the control word processor being adapted to produce a translated digital control word at the digital control word output based on the digital control word at the digital control word input, wherein one of a plurality of translation configurations is selected based on a state of the mode indicator input;
- a mode detector having an input and a mode indicator output, the mode indicator output being connected to the mode indicator input of the control word processor, the mode detector being adapted to assert the mode indicator output when a voltage level at the input is greater than a predetermined reference voltage level, wherein the input of the mode detector is connected to a most significant bit of the digital control word input of the control word processor, and wherein the predetermined reference voltage level is greater than a normal operating voltage of the most significant bit of the digital control word input when asserted;
- a digital-to-analog reference generator having a mode indicator input and a digital-to-analog reference output, the mode indicator input being connected to the mode indicator output of the mode detector, and the digital-to-analog reference output being connected to a reference input on the digital-to-analog converter, wherein the digital-to-analog reference generator is adapted to generate one of a plurality of levels at the digital-to-analog reference output based on a state of the mode indicator input to set a maximum value of the reference signal from the analog output of the digital-to-analog converter; and
- a slew rate bias generator having an output connected to a bias input on the clock, wherein the slew rate bias generator sets a speed of the clock by a current level on the bias input of the clock, wherein a slew rate of the digital-to-analog converter is adjusted by the current level on the bias input of the clock.

18. The electronic system of claim 17, further comprising a notebook computer comprising a power supply having a voltage reference input connected to the analog output of the digital-to-analog converter and a voltage and mode selection output connected to the digital control word input of the control word processor.

* * * * *